United States Patent
Wu et al.

(10) Patent No.: US 11,152,064 B2
(45) Date of Patent: Oct. 19, 2021

(54) MEMORY DEVICE, MEMORY CELL AND METHOD FOR PROGRAMMING MEMORY CELL

(71) Applicant: SAMSUNG ELECTRONICS CO., LTD., Suwon-si (KR)

(72) Inventors: Zhe Wu, Seoul (KR); Ja Bin Lee, Hwaseong-si (KR); Jin Woo Lee, Seoul (KR); Kyu Bong Jung, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 167 days.

(21) Appl. No.: 16/530,517

(22) Filed: Aug. 2, 2019

(65) Prior Publication Data

US 2020/0152264 A1 May 14, 2020

(30) Foreign Application Priority Data

Nov. 14, 2018 (KR) .................... 10-2018-0139645

(51) Int. Cl.
*G11C 13/00* (2006.01)
*H01L 45/00* (2006.01)
*H01L 27/24* (2006.01)

(52) U.S. Cl.
CPC ........ *G11C 13/0069* (2013.01); *G11C 13/004* (2013.01); *G11C 13/0004* (2013.01); *H01L 27/2427* (2013.01); *H01L 27/2481* (2013.01); *H01L 45/144* (2013.01); *G11C 2013/0052* (2013.01); *G11C 2013/0092* (2013.01); *G11C 2213/72* (2013.01); *H01L 45/06* (2013.01); *H01L 45/1233* (2013.01)

(58) Field of Classification Search
CPC ............ G11C 13/0069; G11C 13/0004; G11C 13/004; G11C 2013/0052; G11C 2013/0092; G11C 2213/72; G11C 11/5678; G11C 13/0026; G11C 13/0028; H01L 45/144; H01L 27/2427; H01L 27/2481; H01L 45/06; H01L 45/1233; H01L 45/141
See application file for complete search history.

(56) References Cited

U.S. PATENT DOCUMENTS

| | | | |
|---|---|---|---|
| 7,457,146 B2 | 11/2008 | Philipp et al. | |
| 7,772,029 B2 | 8/2010 | Aratani et al. | |
| 7,952,909 B2 | 5/2011 | Inoue et al. | |
| 10,163,977 B1* | 12/2018 | Fantini | .......... C01B 19/007 |
| 2008/0273379 A1 | 11/2008 | Gordon et al. | |

(Continued)

FOREIGN PATENT DOCUMENTS

| | | |
|---|---|---|
| JP | 4088323 B1 | 5/2008 |
| JP | 2014-075424 A | 4/2014 |

*Primary Examiner* — Mohammed A Bashar
(74) *Attorney, Agent, or Firm* — Lee IP Law, PC

(57) ABSTRACT

A memory device includes a word line, a bit line intersecting the word line, and a memory cell at an intersection of the word line and the bit line. The memory cell includes a first electrode connected to the word line; a second electrode connected to the bit line; and a selective element layer between the first electrode and the second electrode. The selective element layer includes one of Ge—Se—Te, Ge—Se—Te—As, and Ge—Se—Te—As—Si, and a composition ratio of arsenic (As) component of each of the Ge—Se—Te—As and the Ge—Se—Te—As—Si being greater than 0.01 and less than 0.17.

19 Claims, 13 Drawing Sheets

(56) References Cited

U.S. PATENT DOCUMENTS

| | | | |
|---|---|---|---|
| 2009/0108247 A1* | 4/2009 | Takaura | G11C 13/0004 257/2 |
| 2014/0092669 A1 | 4/2014 | Chen et al. | |
| 2017/0330619 A1 | 11/2017 | Bertin et al. | |
| 2018/0026077 A1 | 1/2018 | Wu et al. | |
| 2018/0122472 A1 | 5/2018 | Pirovano et al. | |
| 2018/0138400 A1 | 5/2018 | Bernhardt et al. | |
| 2018/0138405 A1 | 5/2018 | McKerrow et al. | |
| 2018/0138406 A1 | 5/2018 | Kim et al. | |

\* cited by examiner

MEMORY DEVICE, MEMORY CELL AND METHOD FOR PROGRAMMING MEMORY CELL

CROSS-REFERENCE TO RELATED APPLICATION

Korean Patent Application No. 10-2018-0139645, filed on Nov. 14, 2018, in the Korean Intellectual Property Office, and entitled: "Memory Device, Memory Cell and Method for Programming Memory Cell" is incorporated by reference herein in its entirety.

BACKGROUND

1. Field

Embodiments relate to a memory device, a memory cell and a method for programming a memory cell, and more particularly, to a memory device, a memory cell and a method for programming the memory cell, capable of utilizing a selective element as a storage element by inputting a write operation pulse having a falling edge period controlled to a selective element layer made of a specific composition of a material or extending a voltage margin of the storage element.

2. Description of the Related Art

A phase change random access memory (PRAM), also referred to as a phase change memory, is a non-volatile memory using a non-volatile phase change material instead of silicon. The PRAM has both advantages of non-volatility of a flash memory and high speed of a RAM. The PRAM is a memory semiconductor storing data using a phase change of a material, and when the phase changes from an amorphous state to a crystalline state, 1-bit data may be stored. Unlike a semiconductor data storage method in the related art, which stores '0' or '1' data in a storage space within one cell, the PRAM was based on the change from the amorphous state having high resistance to the crystalline state having low resistance when current flows to cells.

SUMMARY

According to an embodiment, a memory device includes a word line, a bit line between the word line, and a memory cell at an intersection point of the word line and the bit line. The memory cell may include: a first electrode connected to the word line; a second electrode connected to the bit line; and a first memory element layer between the first electrode and the second electrode. The first memory element layer may include one of Ge—Se—Te, Ge—Se—Te—As, and Ge—Se—Te—As—Si, and a composition ratio of arsenic (As) component of each of the Ge—Se—Te—As and the Ge—Se—Te—As—Si being greater than 0.01 and less than 0.17.

According to an embodiment, a method for programming a memory cell may include: applying a write operation pulse having a falling edge period extended to a memory cell including a first electrode, a second electrode, and a selective element layer between the first electrode and the second electrode, the selective element layer including a material altering a threshold voltage of the memory cell based on a falling edge period of the write operation pulse; and applying a read operation pulse to the memory cell.

According to an embodiment, a memory cell may include: a first electrode; a second electrode; and a first memory element layer between the first electrode and the second electrode. The first memory element layer may include a material represented by one of $Ge_xSe_yTe_z$ (0.18<x<0.36, 0.4<y<0.65, and 0.02<z<0.2), $Ge_xSe_yTe_zAs_p$ (0.18<x<0.36, 0.4<y<0.65, 0.02<z<0.18, and 0.01<p<0.17), and $Ge_xSe_yTe_zAs_pSi_q$ (0.14<x<0.32, 0.38<y<0.54, 0.02<z<0.18, 0.01<p<0.17, and 0.02<q<0.18).

According to an embodiment, a memory cell may include: a first word line extending in a first direction; a second word line spaced apart from the first word line in a third direction, perpendicular to the first direction, and extending in the first direction; a bit line between the first word line and the second word line and extending in a second direction, perpendicular to the first direction and the third direction; a first memory cell between the first word line and the bit line; and a second memory cell between the second word line and the bit line. Each of the first and second memory cells may include a first electrode, a second electrode and at least one memory element layer between the first electrode and the second electrode. The memory element layer may include a chalcogenide material and be used as both a selective element layer and a storage element layer.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
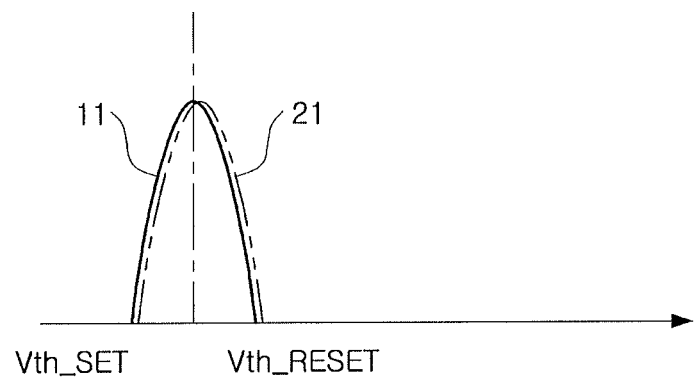
FIG. 1 illustrates a graph of a threshold voltage characteristic of a comparative selective element.
Figure 2:
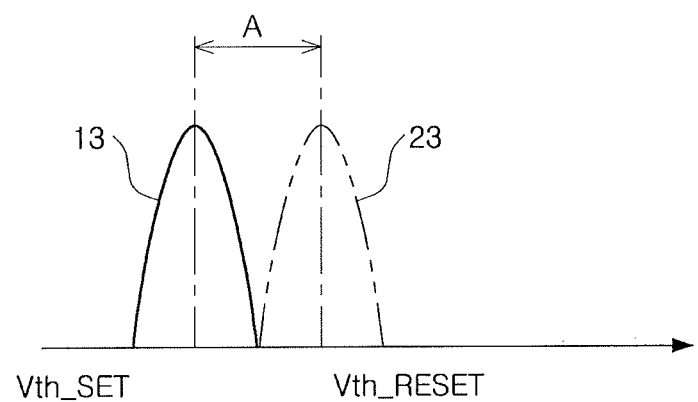
FIG. 2 illustrates a graph of a threshold voltage characteristic of a memory cell including a comparative storage element.

FIG. 1 illustrates a threshold voltage characteristic of a comparative selective element. FIG. 2 illustrates a threshold voltage characteristic of a comparative storage element.

Basically, a memory consists of one selective element and one storage element. In the case of a PRAM, the selective element may be, for example, an ovonic threshold switch (OTS), and the storage element may be, e.g., a GST. GST is a chalcogenide alloy of germanium (Ge), antimony (Sb), and tellurium (Te) (GeSbTe).

In general, the selective element may be an element selecting a cell and its electrical characteristic may be constant without being affected by a write operation pulse. For example, in the case of a comparative PRAM, a diode, a bipolar junction transistor (BJT), an N-channel metal oxide semiconductor (NMOS), and the like may be used as the selective element, and the threshold voltage Vth may not depend on a SET/RESET write operation pulse, but may have a constant value all the time as illustrated in FIG. 1. In particular, a distribution curve 11 and a distribution curve 21 may almost be identical regardless of whether a set voltage or a reset voltage is applied thereto.

Data stored may be distinguished according to changes of characteristics of the storage element. For example, the PRAM may distinguish between 0 and 1 using the threshold voltage difference (or resistance difference) in a GST material. The PRAM has a low resistance and a low threshold voltage in a crystalline state, while having a high resistance and a high threshold voltage in an amorphous state. For example, as illustrated in FIG. 2, the threshold voltage Vth of a storage element depends on which voltage is applied thereto.

However, when a memory is formed using only the threshold voltage difference of the GST, securing a read operation margin may be difficult since the difference in the threshold voltage may be relatively small, as illustrated by difference A between a distribution curve 23 and a distribution curve 13 of FIG. 2. Thus, distribution between the SET/RESET must be managed very strictly.

Figure 3:
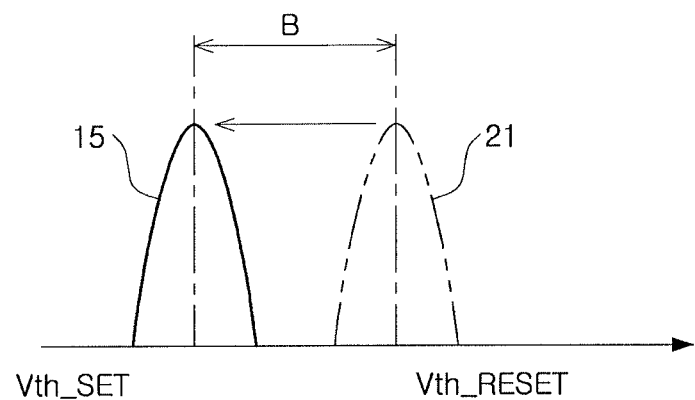
FIG. 3 illustrates a graph of a threshold voltage characteristic of a memory cell according to an example embodiment.
Figure 4:
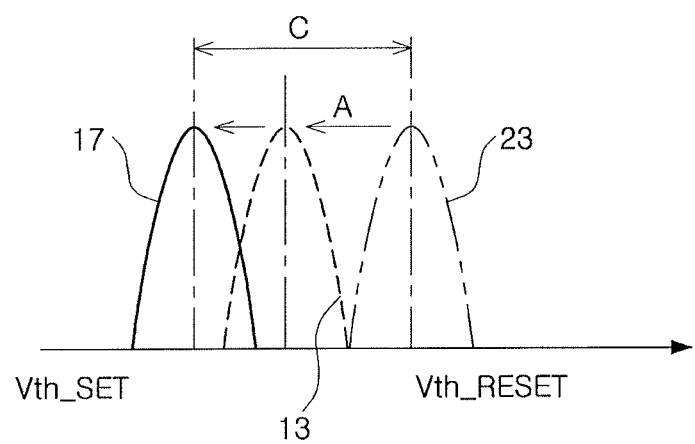
FIG. 4 illustrates a graph of a threshold voltage characteristic of a memory cell according to another example embodiment.

FIG. 3 illustrates a threshold voltage characteristic of a memory cell according to an example embodiment. FIG. 4 illustrates a threshold voltage characteristic of a memory cell according to an example embodiment.

By selecting an ovonic threshold switching (OTS) material in which a threshold voltage changes based on a falling edge period of the write operation pulse, a comparative selective element which was not used for the purpose of storage may be used as a storage device. For example, as illustrated in FIG. 1, the threshold voltage has a constant value regardless of the voltage applied thereto in the comparative selective element. However, according to a memory cell in example embodiments, when the selective element having the above characteristics is used, the difference in the threshold voltage (B of FIG. 3 between the distribution curve 21 and a distribution curve 15) between the SET/RESET may occur by lowering voltage distribution from the distribution curve 11 illustrated in FIG. 1 to the distribution curve 15 illustrated in FIG. 3.

In addition, embodiments provide a method of utilizing a multi-level PRAM by extending, e.g., increasing a margin of the comparative storage element. For example, as illustrated in FIG. 2, unlike the characteristics of comparative storage elements having the difference in the threshold voltage between the SET/RESET of less than about 1.2, according to a memory cell proposed in example embodiments, the difference in the threshold voltage between the SET/RESET may be further increased by lowering voltage distribution in the SET from the distribution curve 13 illustrated in FIGS. 2 and 4 to a distribution curve 17 illustrated in FIG. 4. FIG. 4 illustrates the difference in the threshold voltage between the SET/RESET of a memory cell to which a general storage memory cell is applied, i.e., A, is increased to C in example embodiments having the selective element having the above characteristics and a storage element. Thus, a read operation margin may be readily secured.

Figure 5:
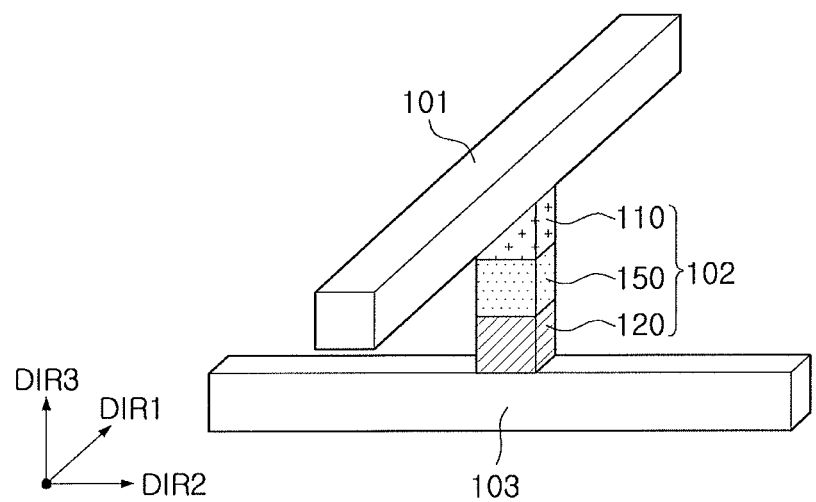
FIG. 5 illustrates a perspective view of a structure of a memory cell according to an example embodiment.
Figure 6:
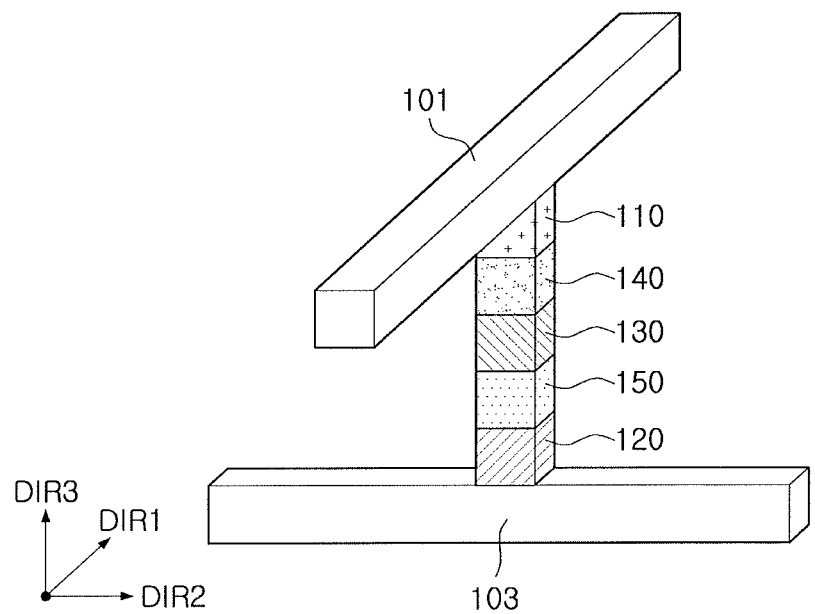
FIGS. 6 and 7 illustrate perspective views of a structure of a memory cell according to example embodiments.
Figure 7:
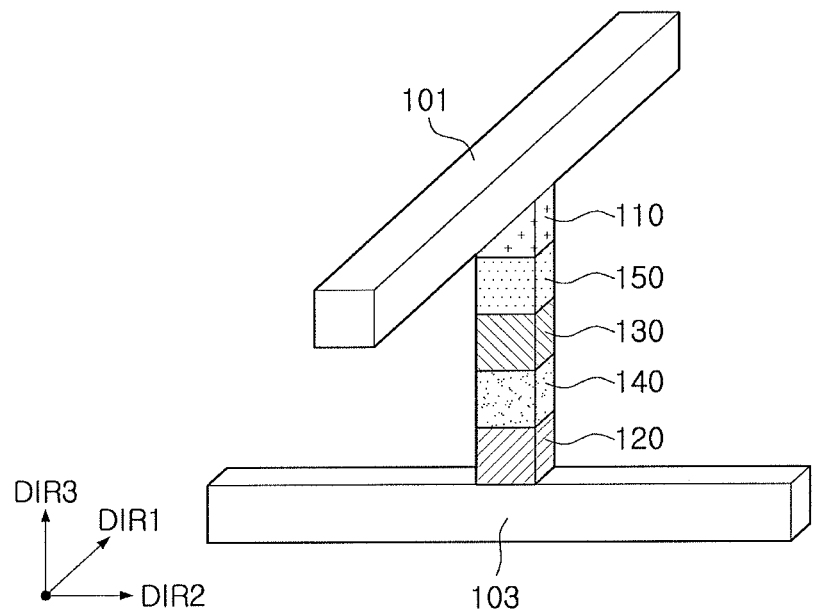
Figure 8:
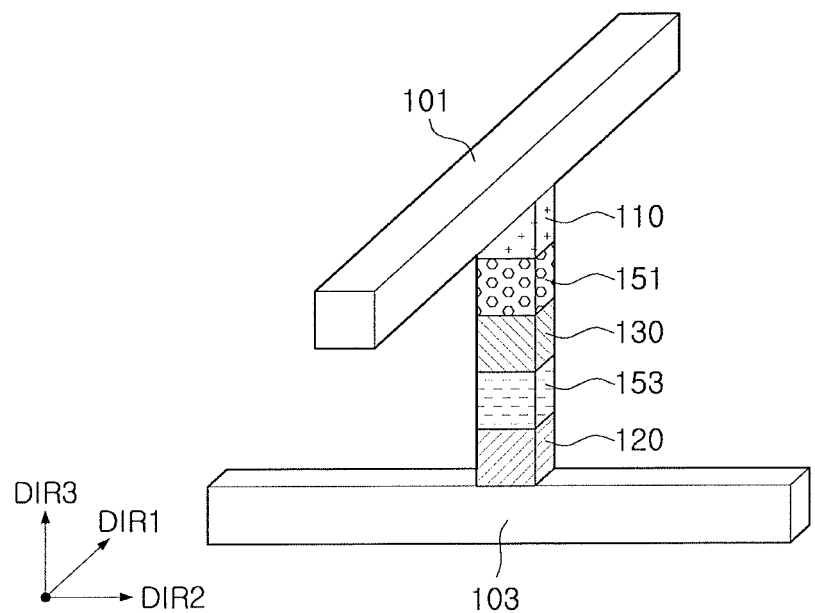
FIG. 8 illustrates a perspective view of a structure of a memory cell according to an example embodiment.
Figure 9:
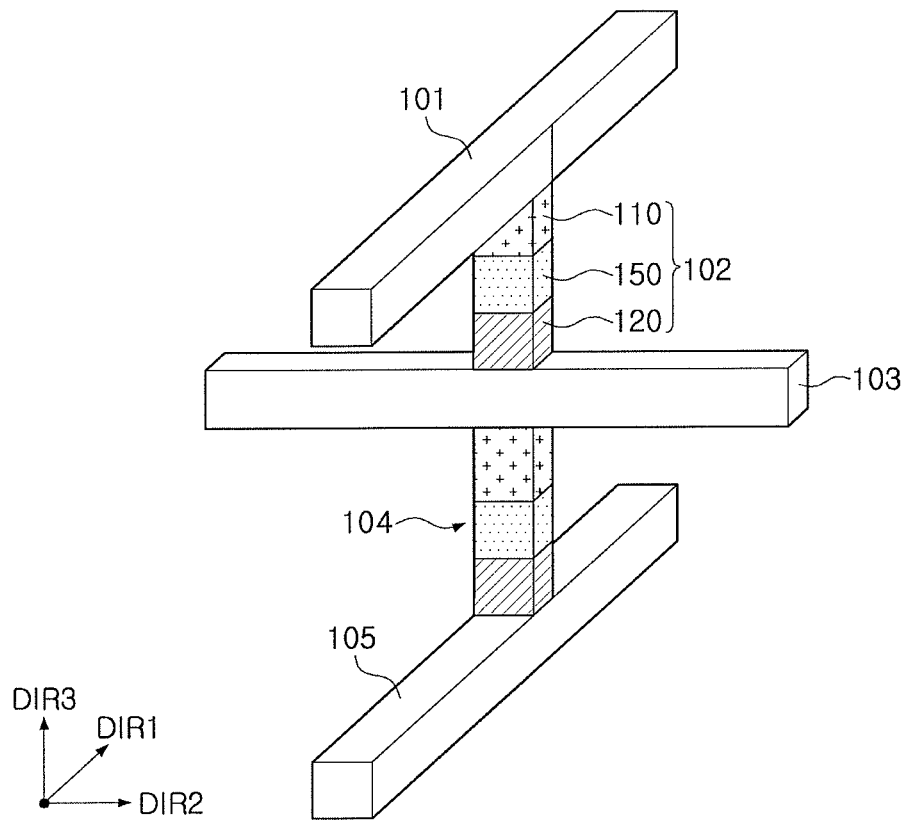
FIG. 9 illustrates a perspective view of a structure of a memory cell according to an example embodiment.

FIG. 5 illustrates a structure of a memory cell according to an example embodiment. FIGS. 6 and 7 illustrate structures of a memory cell according to an example embodiment. FIG. 8 illustrates a structure of a memory cell according to an example embodiment. FIG. 9 illustrates a structure of a memory cell according to an example embodiment.

Referring to FIG. 5, a memory cell according to an example embodiment may include a first electrode 110, a second electrode 120, and a first memory element layer 150. The first electrode 110 and the second electrode 120 may be connected to a word line 101 extending in a first direction DIR1 and a bit line 103 extending in a second direction DIR2 perpendicular to the first direction DIR1, respectively. The word line 101 and the bit line 103 may be spaced apart from each other in a third direction DIR3, perpendicular to the first direction DIR1 and the second direction DIR2. And, a memory cell according to example embodiments may be formed at an intersection of the word line 101 and the bit line 103, as illustrated in FIGS. 5 to 8.

The first memory element layer 150 according to example embodiments may be formed between the first electrode 110 and the second electrode 120. The first memory element layer 150 may include a material altering a threshold voltage of a memory cell based on a falling edge period of a write operation pulse. The material altering the threshold voltage of the memory cell based on the falling edge period of the write operation pulse may be one of $Ge_xSe_yTe_z$ ($0.18<x<0.36$, $0.4<y<0.65$, and $0.02<z<0.2$), $Ge_xSe_yTe_zAs_p$ ($0.18<x<0.36$, $0.4<y<0.56$, $0.02<z<0.18$, and $0.01<p<0.17$), $Ge_xSe_yTe_zAs_pSi_q$ ($0.14<x<0.32$, $0.38<y<0.54$, $0.02<z<0.18$, $0.01<p<0.17$, and $0.02<q<0.18$), and the like. All of these compositions either have no arsenic (As) or a lower ratio of arsenic (As) than other components. The first memory element layer 150 may be used as both a selective element layer and a storage element layer.

A structure of a memory cell according to example embodiments, as illustrated in FIGS. 6 to 8, may further include a third electrode 130 between the first electrode 110 and the second electrode 120.

In the example embodiments, first, as illustrated in FIG. 6, a second memory element layer 140 may be formed between the first electrode 110 and the third electrode 130, and the first memory element layer 150 may be formed between the second electrode 120 and the third electrode 130.

In addition, as illustrated in FIG. 7, the second memory element layer 140 may be formed between the second electrode 120 and the third electrode 130, and the first memory element layer 150 may be formed between the first electrode 110 and the third electrode 130.

Further, as illustrated in FIG. 8, a first selective element layer 151 may be formed between the first electrode 110 and the third electrode 130, and a second selective element layer 153 may be formed between the second electrode 120 and the third electrode 130. Each of the first selective element layer and the second selective element layer may have a chalcogenide material, e.g., a Ge—Se—Te, Ge—Se—Te—As, Ge—Se—Te—As—Si. In this case, the types and/or the composition ratios of the materials included in the first selective element layer 151 and the second selective element layer 153 may be the same as or different from each other.

Referring to FIG. 9, each of a first memory cell 102 and a second memory cell 104 according to an example embodiment may include a first electrode 110, a second electrode 120, and a first memory element layer 150. The first memory cell 102 may be disposed between a first word line 101 and a bit line 103. The second memory cell 104 may be disposed between a bit line 103 and a second word line 105. The first word line 101 and the second word line 105 may be extending in a first direction DIR1, and be space apart from each other in a third direction DIR3, perpendicular to the first direction DIR1 and a second direction DIR2. The bit line 103 may be extending in a third direction DIR2, perpendicular to the first direction DIR1.

Each of the first memory cell 102 and the second memory cell 104 may have another structure as illustrated in FIGS. 6 to 8. For example, each of the first memory cell 102 and the second memory cell 104 may further include a third electrode between the first electrode 110 and the second electrode 120, and a second memory element layer. In this case, the first memory element layer may be disposed between the first electrode and the third electrode, and the second memory element layer may be disposed between the second electrode and the third electrode. The first memory element layer 150 and the second memory element layer may include a chalcogenide material altering a threshold voltage of each of the first and second memory cells 102, 104 based on a falling edge period of a write operation pulse. The chalcogenide material may have no arsenic (As) or a lower ratio of arsenic (As) than other components of the material. Each of the first memory element layer 150 and the second memory element layer may be used as a selective element layer and/or a storage element layer.

Figure 10:
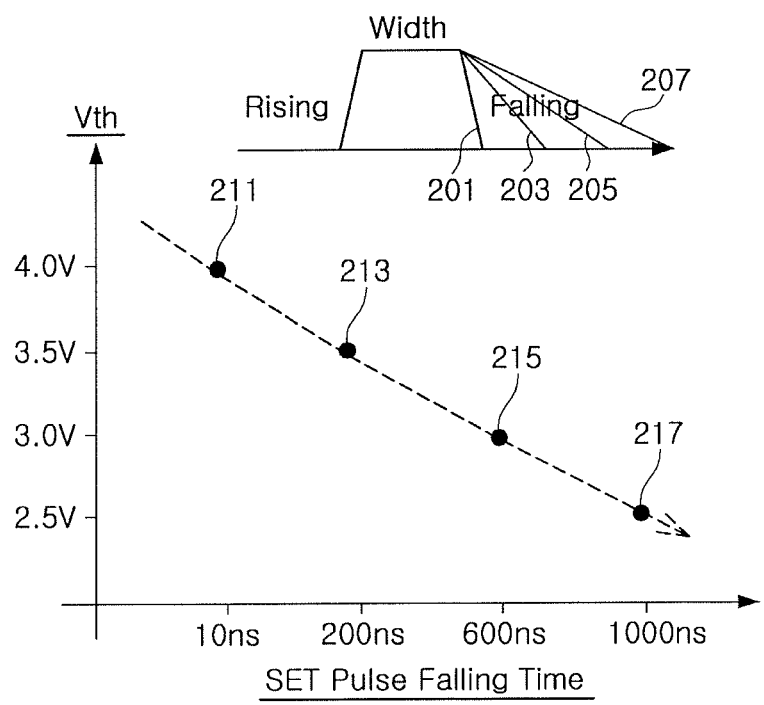
FIG. 10 illustrates a graph of a change of a threshold voltage of a memory cell having a SET state based on a falling edge period according to example embodiments.
Figure 11:
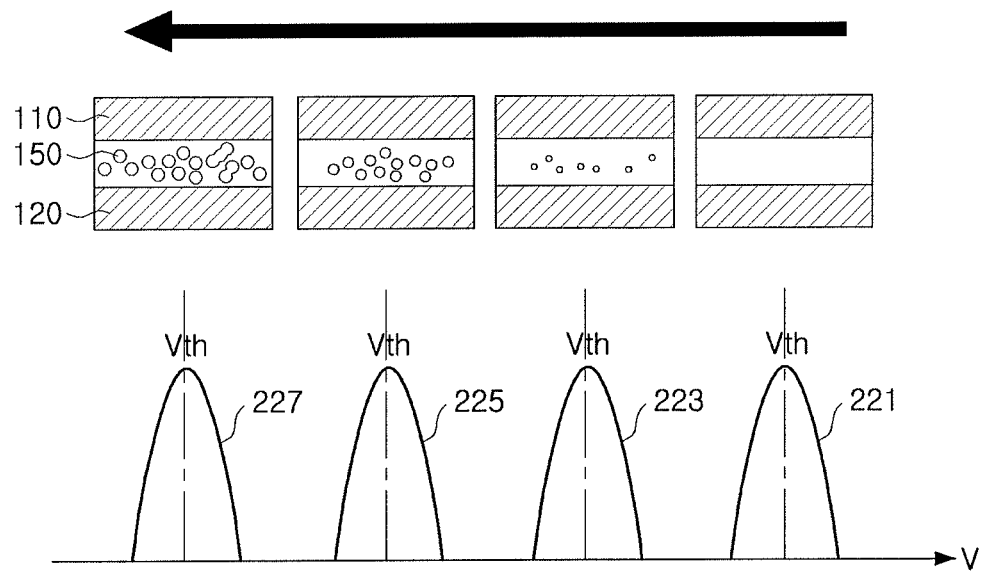
FIG. 11 illustrates a graph of a change of a selective element layer based on a falling edge period and a change of a threshold voltage of a memory cell having a SET state according to example embodiments.

FIG. 10 is a graph of a change of a threshold voltage of a memory cell having a SET state based on a falling edge period according to example embodiments. FIG. 11 is a graph of a change of the selective element layer based on a falling edge period according to example embodiments and a change of a threshold voltage of a memory cell having a SET state.

The selective element layers 150, 151, and 153 applied in example embodiments may have the threshold voltage of the memory cell, which is altered based on the falling edge period of the operation pulse as described above.

Referring to FIG. 10, as the falling edge period of the operation pulse increases from 10 ns (201) to 200 ns (203), 600 ns (205) and 1000 ns (207), a threshold voltage (Vth) value of the memory cell including the selective element layer may be lowered from about 4 V (211) to about 2.5 V (207). This is because, as illustrated in FIG. 11, the size and the number of the crystalline structures formed in the selective element layer 150, 151, and 153 change based on the falling edge period of the operation pulse. Voltage distribution curves 221, 223, 225 and 227 illustrated in FIG. 11 result from applying the falling edge periods of the write operation pulse of 10 ns (201), 200 ns (203), 600 ns (205) and 1000 ns (207), respectively, and state changes of crystalline structures occurring in the selective element layers 150, 151, and 153 are illustrated, corresponding to upper sides of the respective distribution curves 221, 223, 225, and 227, respectively.

Figure 12:
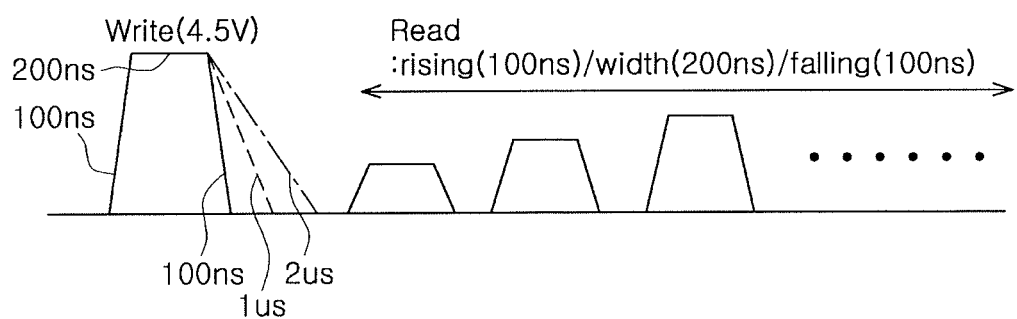
FIG. 12 illustrates write operation pulses having various falling edge periods.
Figure 13:
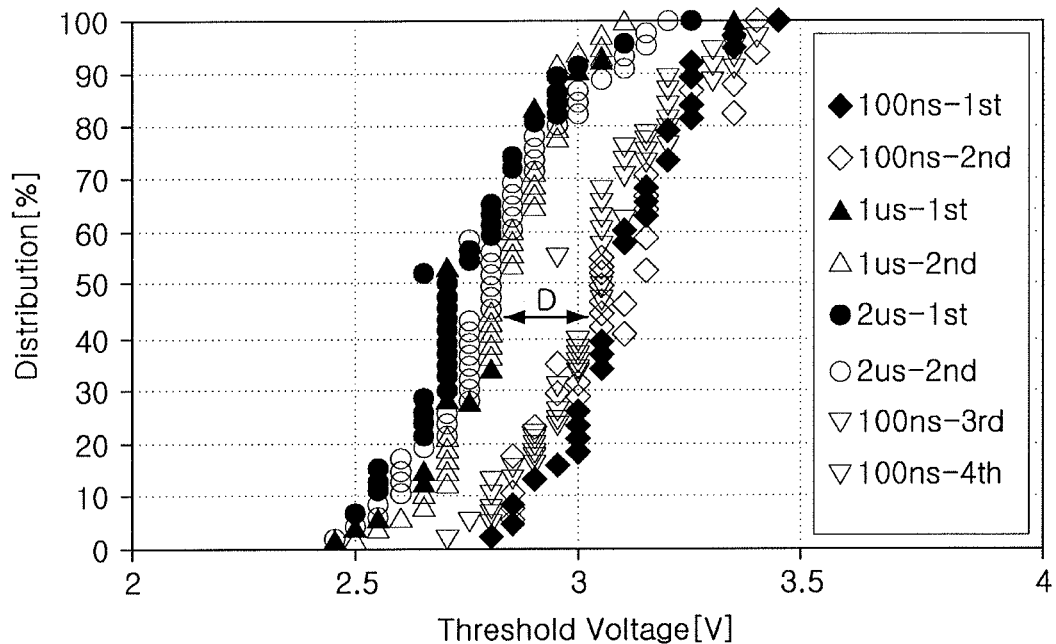
FIG. 13 illustrates a graph obtained experimentally of changes in a threshold voltage occurring when the write operation pulse having various falling edge periods illustrated in FIG. 12 is applied to a memory cell according to example embodiments.
Figure 14:
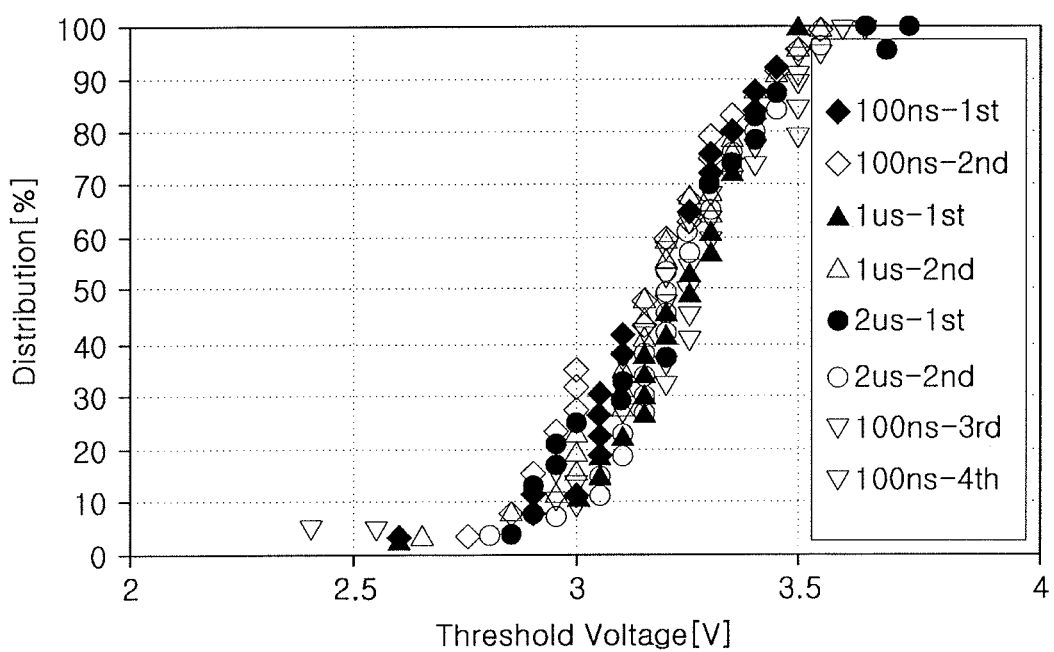
FIG. 14 illustrates a graph obtained experimentally of changes in a threshold voltage when the write operation pulse having various falling edge periods illustrated in FIG. 12 is applied to a comparative selective element.

The change of the threshold voltage (Vth) value based on the falling edge period of the operation pulse as described above may also be confirmed experimentally. FIG. 12 illustrates a write operation pulse having various falling edge periods are applied thereto. FIG. 13 is a graph obtained experimentally that shows changes of a threshold voltage occurring when the write operation pulse having various edge periods illustrated in FIG. 12 are applied to a memory cell according to example embodiments. FIG. 14 is a graph obtained experimentally that shows changes of a threshold voltage occurring when the write operation pulse having various falling edge periods illustrated in FIG. 12 are applied to a comparative selective element.

As illustrated in FIG. 12, the change of the threshold voltage of the memory cell according to example embodiments is illustrated in FIG. 13, when the falling edge periods of the write operation pulse are set to 100 ns, 1 μs and 2 μs, respectively. Referring to FIG. 13, when the falling edge period of the write operation pulse is set to 1 μs or 2 μs, the threshold voltage is lowered by about D compared to the case in which the falling edge period is 100 ns. In contrast, when a write operation pulse having different falling edge periods applied thereto is applied to a comparative selective element, there are negligible differences.

As described above, according to example embodiments including the selective element having the above characteristics, the voltage distribution between SET/RESET may be further spaced than that of the comparative example, as may be seen by comparing FIG. 3 and FIG. 1. Thus, the voltage distribution between the SET/RESET may be distinguished as illustrated in FIG. 3, such that the selective element may be utilized as a memory even with a very simplified structure, as illustrated in FIG. 5.

In addition, as illustrated in FIGS. 6 and 7, even in a memory cell structure composed of one storage element and one selective element, as compared with the case of FIG. 2 in which the comparative selective element material is applied, the voltage margin between the SET/RESET may be further increased as illustrated in FIG. 4. Therefore, the memory cell may be utilized as a multi-level cell capable of storing multi-bit data per cell. That is, according to a memory cell according to example embodiments, apart from a general flash memory storing 1-bit data per cell, a plurality of bits per cell may be stored by extending the voltage margin between the SET/RESET while having the same structure as a comparative cell.

Thus, as evident from the experimental data, the voltage margin between the SET/RESET of the memory cell according to example embodiments may be increased, e.g., to 2.3V, compared in to the comparative memory cell.

Figure 15:
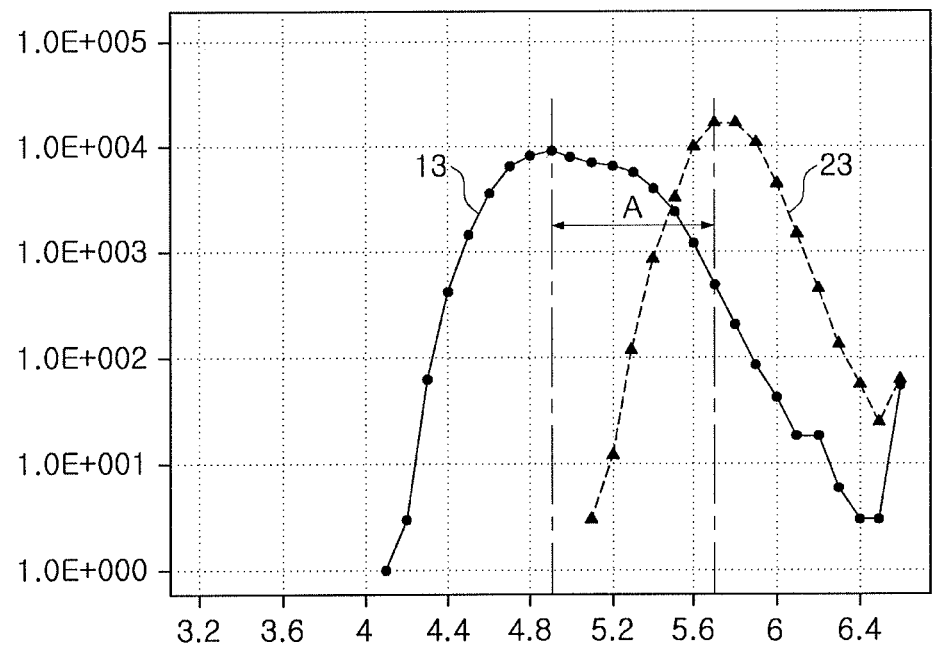
FIG. 15 illustrates a graph obtained experimentally of a threshold voltage characteristic of a comparative memory cell obtained through experiments.
Figure 16:
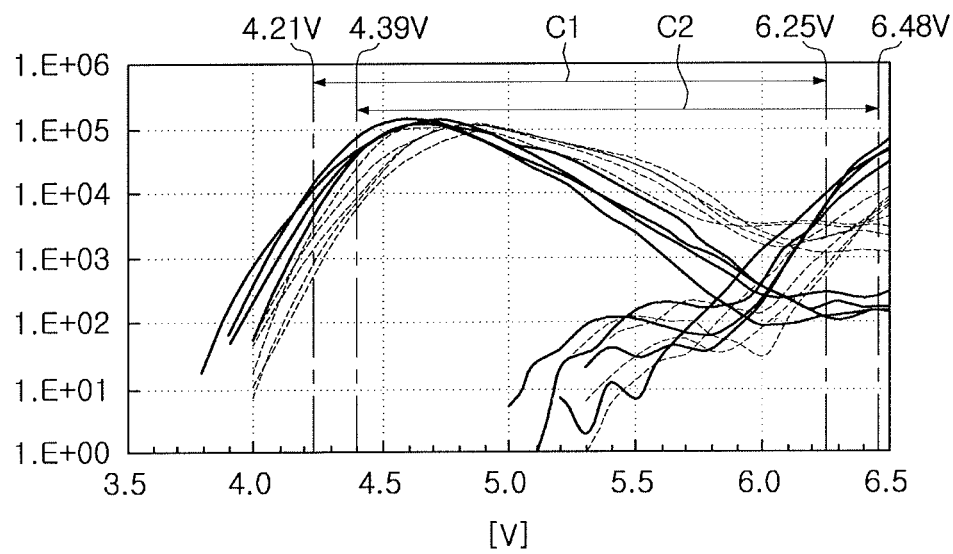
FIG. 16 illustrates a graph obtained experimentally of a threshold voltage characteristic of a memory cell according to an example embodiment.

FIG. 15 is a graph obtained experimentally illustrating a threshold voltage characteristic of a comparative memory cell. FIG. 16 is a graph obtained experimentally illustrating a threshold voltage characteristic of a memory cell according to an example embodiment. As can be seen therein the difference (voltage margin, A) in the threshold voltage between the SET/RESET illustrated in FIG. 15 is increased, e.g., to C1 or C2, as illustrated in FIG. 16. Distribution curves 13 and 23 illustrated in FIG. 15 may correspond to voltage distribution curves between the SET/RESET illustrated in FIG. 2, respectively. The voltage margins C1 or C2, illustrated in FIG. 16 result from performing experiments under slightly different conditions, respectively, and show voltage margins of 2.04V and 2.09V, respectively, which are increased as compared with the voltage margin (A) illustrated in FIG. 15.

The memory cell proposed in example embodiments tends to decrease as the falling edge period of the write operation pulse becomes longer as described above. However, when a pulse having an increased falling edge period is applied again, the threshold voltage may be restored to its original magnitude. Therefore, before the next read operation is performed on the memory cell proposed in example embodiments, a write operation pulse having the short falling edge period may be applied again to the memory cell. For example, if a SET write operation pulse has a falling edge period of 1.5 µs, a RESET write operation pulse and a read operation pulse have a falling edge period of 10 ns, a difference between the SET and RESET in the threshold voltage of the selective element layer may be 2.3 V, after applying the SET write operation pulse to the memory cell. However, if a read operation pulse is applied to the memory cell, the difference may be reduced to almost zero. As a result, the read margin of a next read operation may be greatly reduced. Therefore, it is necessary to reapply the SET write operation pulse having the falling edge period of 1.5 µs to the memory cell before the next read operation.

Figure 17:
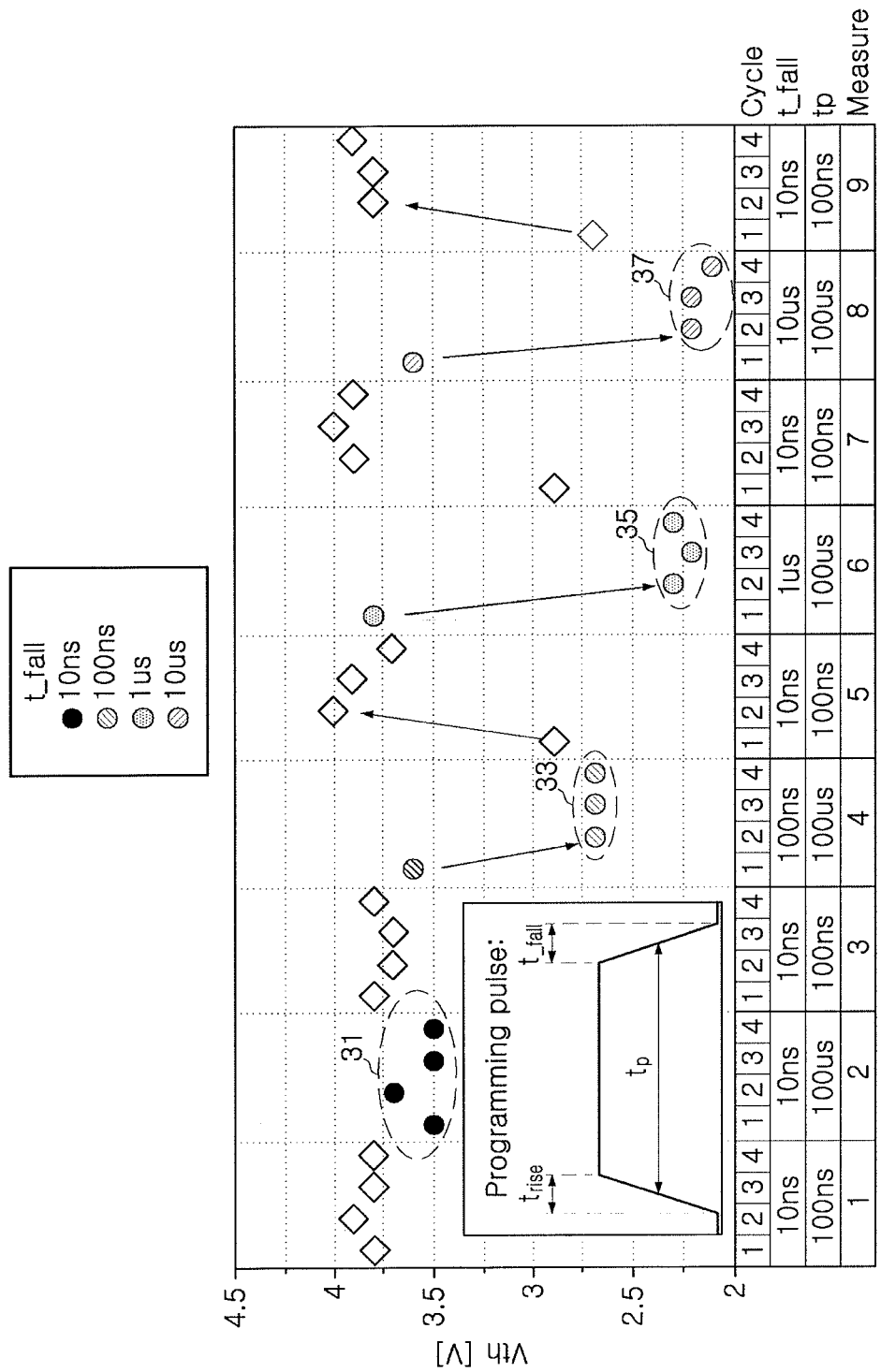
FIGS. 17 and 18 illustrate graphs obtained experimentally of changes of a threshold voltage occurring when various falling edge periods are applied to the memory cell according to example embodiments when a read operation and a write operation are repeated.
Figure 18:
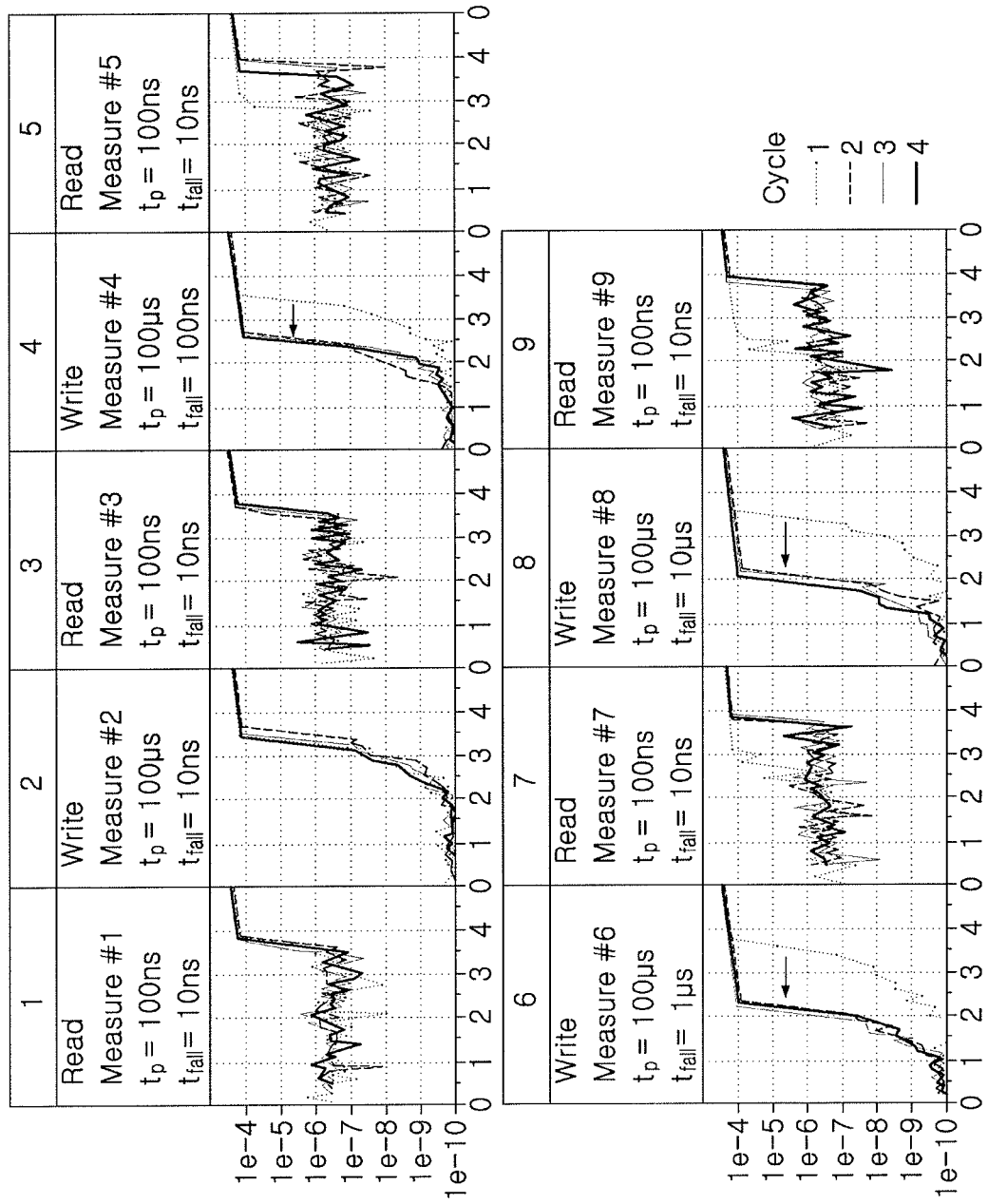

FIGS. 17 and 18 are graphs obtained experimentally showing changes of a threshold voltage occurring when various falling edge periods are applied to the memory cell according to example embodiments when the read operation and the write operation are repeated. FIGS. 17 and 18 illustrate results of applying a same read operation pulse and write operation pulses having different falling edge periods, e.g., 10 ns, 100 ns, 1 µs, and 10 µs, respectively.

In FIGS. 17 and 18, the resultant data of the read operation is commonly recorded in measurements 1, 3, 5, 7 and 9, respectively, and the resultant data of the write operation having different falling edge periods is recorded in measurements 2, 4, 6 and 8, respectively. As shown in FIG. 17, a threshold voltage value measured by setting the falling edge period of the write operation pulse at 10 ns is not significantly lowered, see voltage 31, but a threshold voltage value decreases, see voltages 33, 35, and 37, as the falling edge period increases, e.g., 100 ns, 1 µs, and 10 µs. Such a change in the threshold voltage may also be confirmed through graphs illustrated in the measurements 4, 6, and 8 in FIG. 18.

As described as above, the selective element layers 150, 151, and 153 may include a material altering the threshold voltage of the memory cell based on the falling edge period of the write operation pulse. Here, the material altering the threshold voltage of the memory cell based on the falling edge period of the write operation pulse has no arsenic (As) or a lower ratio of arsenic (As) than other components of the material.

Figure 19:
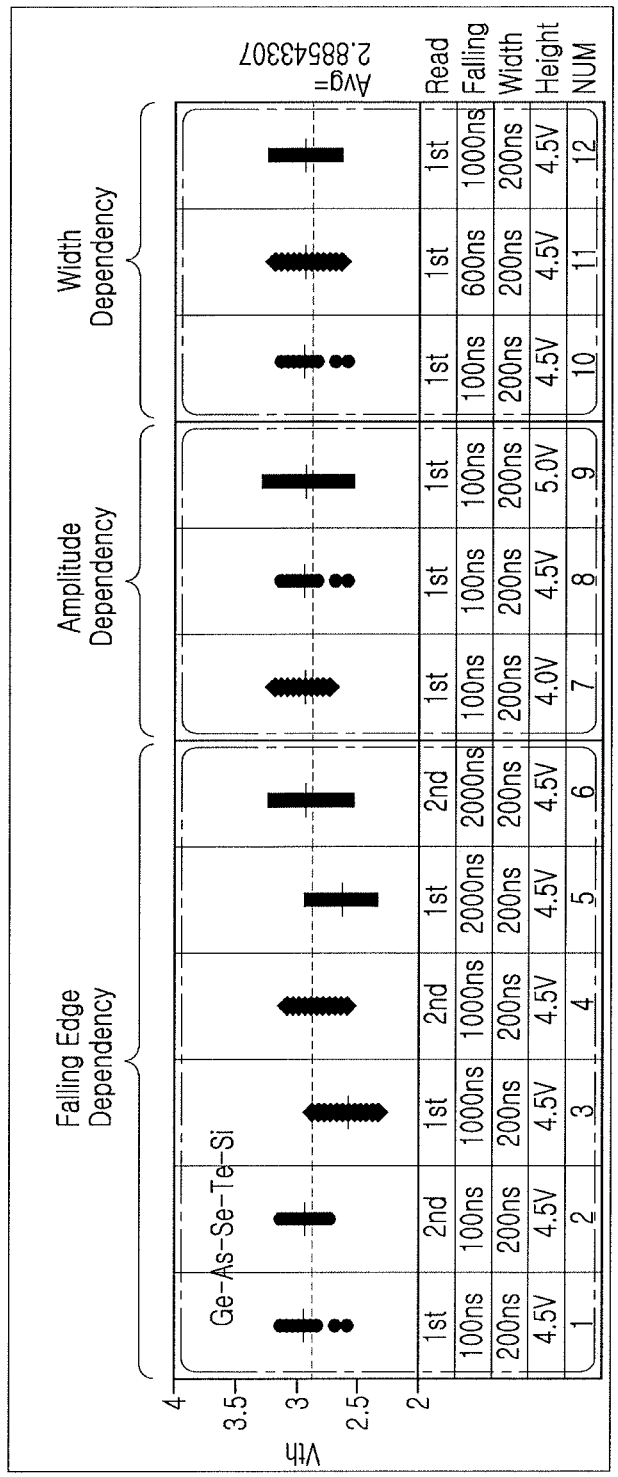
FIGS. 19 and 20 illustrate graphs obtained experimentally of changes of a threshold voltage occurring when a write operation pulse to which various falling edge periods are applied to a memory cell including a selective element layer having a low arsenic component according to example embodiments.
Figure 20:
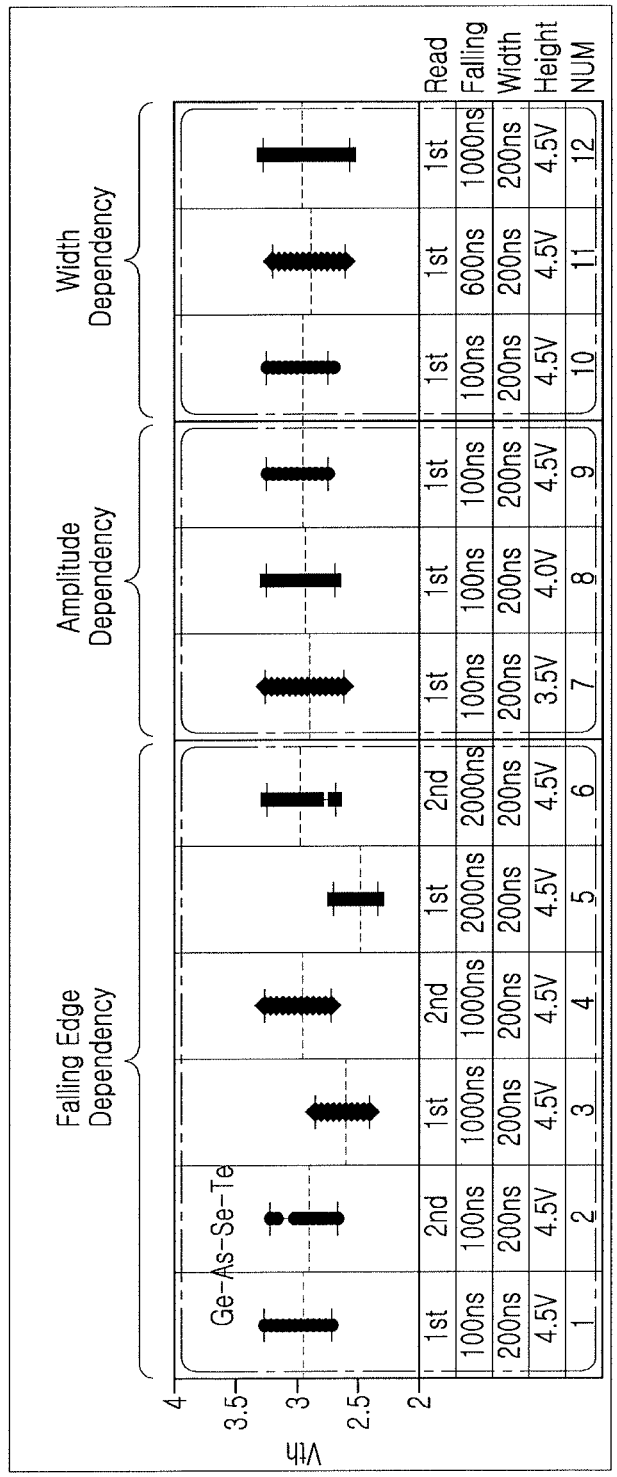

The experimental data in which the threshold voltage of the memory cell is altered based on the falling edge period of the write operation pulse is illustrated in FIGS. 19 and 20. FIGS. 19 and 20 are graphs obtained experimentally that show changes of a threshold voltage occurring when the write operation pulse having various edge periods applied thereto is applied to the memory cell including a selective element layer having a low arsenic (As) component according to example embodiments. FIG. 19 illustrates an experimental data for a memory cell including a selective element layer made of Ge, As, Se, Te, Si components, and FIG. 20 illustrates an experimental data for a memory cell including a selective element layer made of Ge, As, Se, Te components. Commonly, when the falling edge period increases, the threshold voltage decreases. Further, the change of the threshold voltage is independent of an amplitude and a duration of the operation pulse.

Figure 21:
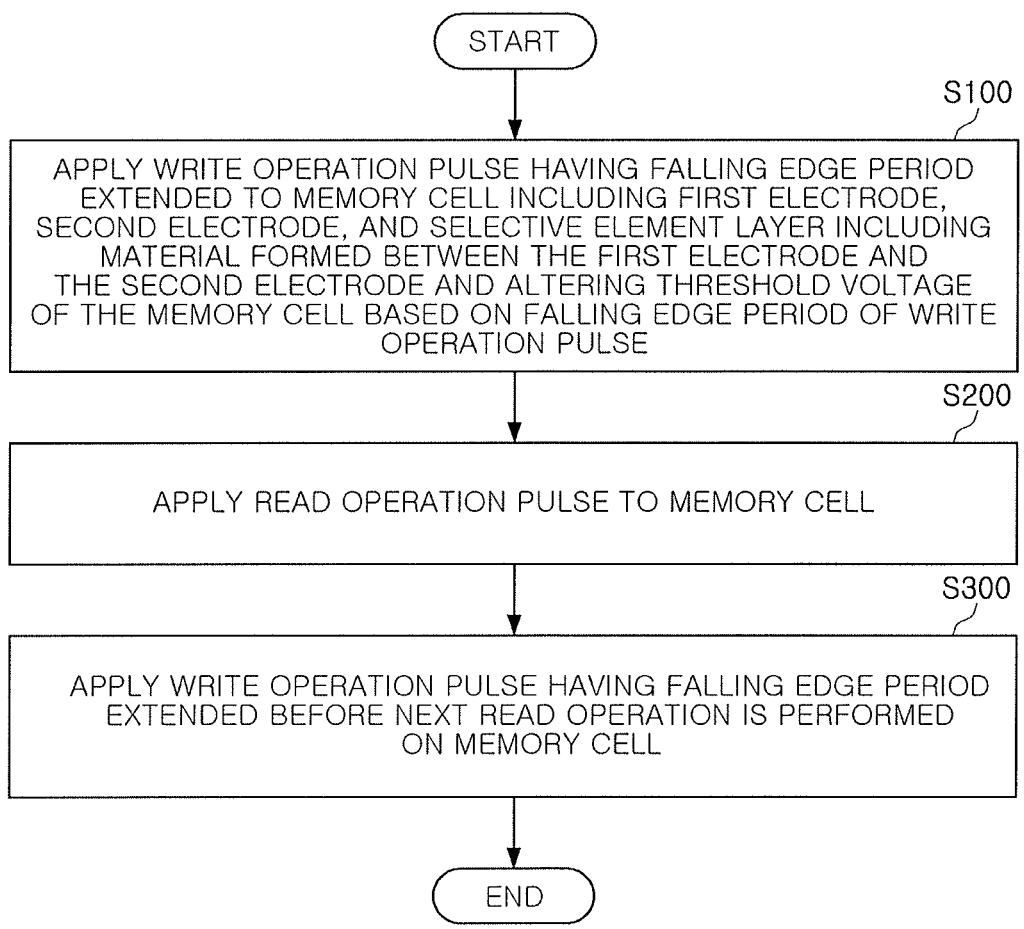
FIG. 21 illustrates a flowchart of a method for programming a memory cell according to example embodiments.

FIG. 21 is a flowchart of a method for programming a memory cell according to an example embodiment.

A method for programming a memory cell according to an example embodiment may include applying a write operation pulse having a falling edge period extended (S100: a first operation) to a memory cell including a first electrode, a second electrode, and a selective element layer between the first electrode and the second electrode, and including a material altering a threshold voltage of a memory cell based on the falling edge period of the write operation pulse, and applying a read operation pulse (S200: a second operation) to a memory cell.

That is, by applying the write operation pulse having the falling edge period extended to a memory cell according to example embodiments, a memory cell having a simple structure including a layer including an OTS material, as illustrated in FIG. 5, may be used as a storage element or a read operation may be formed, after a read voltage margin of a memory cell having a structure illustrated in FIGS. 6 to 9, is extended.

In addition, as described above, since the memory cell proposed in example embodiments has the characteristic in which the threshold voltage recovers to its original magnitude again, when a pulse having a short falling edge period is applied again. Therefore, before the next read operation is performed, a write operation pulse having a falling edge period extended (S300: a third operation) may be applied, and a preparation operation for the read operation may be performed again.

As a result, according to example embodiments of the memory device, the memory cell and the method for manufacturing the memory cell, by inputting a write operation pulse having a falling edge period controlled to a selective element layer made of the specific composition of a material, and the selective element may be utilized as the storage element or may extend the voltage margin of the storage element.

As set forth above, according to example embodiments of the memory device, memory cell, and the method for manufacturing the memory cell, by applying a write operation pulse having an increased falling edge period to the selective element layer made of a specific composition, the selective element may be utilized as a storage element or the voltage margin of the storage element may be increased.

One or more embodiments provide a memory device, a memory cell and a method for programming a memory cell capable of utilizing a selective element as a storage element by applying a write operation pulse having an increased falling edge period to a selective element layer made of a specific composition, the selective element may be utilized as a storage element or the voltage margin of the storage element may be increased.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A memory device, comprising:
   a word line;
   a bit line intersecting the word line; and
   a memory cell between the word line and the bit line, the memory cell including a first electrode connected to the word line, a second electrode connected to the bit line, and a first memory element layer between the first electrode and the second electrode, the first memory element layer including:
   $Ge_xSe_yTe_z$ in which $0.18<x<0.36$, $0.4<y<0.65$, and $0.02<z<0.2$,
   Ge—Se—Te—As in which a composition ratio of arsenic (As) is greater than 0.01 and less than 0.17, or
   Ge—Se—Te—As—Si in which a composition ratio of arsenic (As) is greater than 0.01 and less than 0.17,
   wherein Ge indicates Germanium, Se indicates Selenium, Te indicates Tellurium, As indicates Arsenic, and Si indicates Silicon, and
   wherein the memory device is configured to alter a threshold voltage of the memory cell based on a duration of a falling edge period of a write operation pulse.

2. The memory device as claimed in claim 1, wherein the memory cell further includes:
   a third electrode between the first electrode and the second electrode; and
   a second memory element layer between the first electrode and the third electrode, the first memory element layer being between the second electrode and the third electrode.

3. The memory device as claimed in claim 1, wherein the memory cell further includes:
   a third electrode between the first electrode and the second electrode; and
   a second memory element layer between the second electrode and the third electrode, the first memory element layer being between the first electrode and the third electrode.

4. The memory device as claimed in claim 1, wherein:
   the memory cell further includes a third electrode between the first electrode and the second electrode, and
   the first memory element layer includes a first selective element layer between the first electrode and the third electrode, and a second selective element layer between the second electrode and the third electrode.

5. The memory device as claimed in claim 1, wherein a size and a number of crystalline structures formed in the first memory element layer change based on the falling edge period of the write operation pulse.

6. The memory device as claimed in claim 1, wherein the threshold voltage of the memory cell decreases as the falling edge period of the write operation pulse increases.

7. The memory device as claimed in claim 6, wherein the memory device is configured to apply another write operation pulse to the memory cell after a first read operation is performed and before a second, subsequent read operation is performed.

8. The memory device of any one as claimed in claim 1, wherein the memory cell is a multi-level cell.

9. A memory cell, comprising:
   a first electrode;
   a second electrode; and
   a first memory element layer between the first electrode and the second electrode, the first memory element layer including a material represented by one of Formulas 1 to 3 below:

$$Ge_xSe_yTe_z \qquad \text{[Formula 1]}$$

wherein, in Formula 1, $0.18<x<0.36$, $0.4<y<0.65$, and $0.02<z<0.2$;

$$Ge_xSe_yTe_zAs_p \qquad \text{[Formula 2]}$$

wherein, in Formula 2, $0.18<x<0.36$, $0.4<y<0.65$, $0.02<z<0.18$, and $0.01<p<0.17$; and $$Ge_xSe_yTe_zAs_pSi_q \qquad \text{[Formula 3]}$$

wherein, in Formula 3, $0.14<x<0.32$, $0.38<y<0.54$, $0.02<z<0.18$, $0.01<p<0.17$, and $0.02<q<0.18$,
   wherein a threshold voltage of the memory cell alters based on a duration of a falling edge period of a write operation pulse.

10. The memory cell as claimed in claim 9, wherein the memory cell further includes:
    a third electrode between the first electrode and the second electrode; and
    a storage element layer between the first electrode and the third electrode, the first memory element layer being between the second electrode and the third electrode.

11. The memory cell as claimed in claim 9, wherein:
    the memory cell further includes a third electrode between the first electrode and the second electrode, and
    the first memory element layer includes a first chalcogenide layer between the first electrode and the third electrode, and a second chalcogenide layer between the second electrode and the third electrode.

12. The memory cell as claimed in claim 9, wherein the threshold voltage of the memory cell decreases as the falling edge period of the write operation pulse increases.

13. A memory device, comprising:
    a first word line extending in a first direction;
    a second word line spaced apart from the first word line in a third direction, perpendicular to the first direction, and extending in the first direction;
    a bit line between the first word line and the second word line and extending in a second direction, perpendicular to the first direction and the third direction;
    a first memory cell between the first word line and the bit line; and
    a second memory cell between the second word line and the bit line,
    wherein each of the first and second memory cells includes a first electrode, a second electrode and at least one memory element layer between the first electrode and the second electrode, the memory element layer including a chalcogenide material and being used as both a selective element layer and a storage element layer.

14. The memory device as claimed in claim 13, wherein the chalcogenide material includes an arsenic (As) component having a composition ratio greater than 0.01 and less than 0.17.

15. The memory device as claimed in claim 13, wherein the chalcogenide material excludes an arsenic (As) component.

16. The memory device as claimed in claim 13, wherein a size and a number of crystalline structures formed in the memory element layer change based on a falling edge period of a write operation pulse.

17. The memory device as claimed in claim 13, wherein the chalcogenide material alters a threshold voltage of the first and second memory cells based on a falling edge period of a write operation pulse.

18. The memory device as claimed in claim 13, wherein:
each of the first and the second memory cells further includes a third electrode between the first electrode and the second electrode, and
the memory element layer includes a first memory element layer between the first electrode and the third electrode, and a second memory element layer between the second electrode and the third electrode.

19. The memory device as claimed in claim 18, wherein:
the first memory element layer is used as a selective layer, and
the second memory element layer is used as a storage element layer.

* * * * *